US012580160B2

(12) United States Patent
Sako et al.

(10) Patent No.: US 12,580,160 B2
(45) Date of Patent: Mar. 17, 2026

(54) ETCHING METHOD AND ETCHING APPARATUS

(71) Applicant: Tokyo Electron Limited, Minato-ku (JP)

(72) Inventors: Takuji Sako, Nirasaki City (JP); Kyohei Noguchi, Nirasaki City (JP); Masaki Hosono, Nirasaki City (JP); Masahiro Yamamoto, Minato-ku (JP); Julen Arozamena, Boise, ID (US)

(73) Assignee: Tokyo Electron Limited, Tokyo (JP)

( * ) Notice: Subject to any disclaimer, the term of this patent is extended or adjusted under 35 U.S.C. 154(b) by 410 days.

(21) Appl. No.: 18/067,917

(22) Filed: Dec. 19, 2022

(65) Prior Publication Data

US 2024/0203694 A1    Jun. 20, 2024

(51) Int. Cl.
   *H01J 37/32*          (2006.01)
(52) U.S. Cl.
   CPC .................. *H01J 37/32449* (2013.01); *H01J 37/32724* (2013.01); *H01J 37/32357* (2013.01); *H01J 37/32816* (2013.01); *H01J 2237/1825* (2013.01); *H01J 2237/334* (2013.01)
(58) Field of Classification Search
   None
   See application file for complete search history.

(56) References Cited

U.S. PATENT DOCUMENTS

| 2018/0226259 A1* | 8/2018 | Choi ................. H01J 37/32091 |
| 2021/0358761 A1* | 11/2021 | Takahashi ........... H01J 37/3244 |
| 2023/0207291 A1* | 6/2023 | Olsen ........................ C23C 8/36 |
| | | 438/771 |
| 2024/0112903 A1* | 4/2024 | Lo ..................... H01L 21/02236 |

FOREIGN PATENT DOCUMENTS

| JP | H09-260361 A | 10/1997 |
| KR | 10-2022-0085722 A | 6/2022 |

* cited by examiner

*Primary Examiner* — Binh X Tran
(74) *Attorney, Agent, or Firm* — Armstrong Teasdale LLP

(57) ABSTRACT

An etching method of etching silicon formed on a side surface of a recess that exists in a substrate includes: forming an oxide film on a surface of the silicon by performing a radical oxidation processing on the substrate; performing a chemical processing with a gas on the oxide film; and removing a reaction product produced by the chemical processing, wherein the forming the oxide film includes: a first phase of performing a radical processing with a plasma of an oxygen-containing gas; and a second phase of performing a radical processing with a plasma of the oxygen-containing gas and an etching gas, and wherein the forming the oxide film, the performing the chemical processing, and the removing the reaction product are repeated multiple times.

17 Claims, 10 Drawing Sheets

Figure 3:
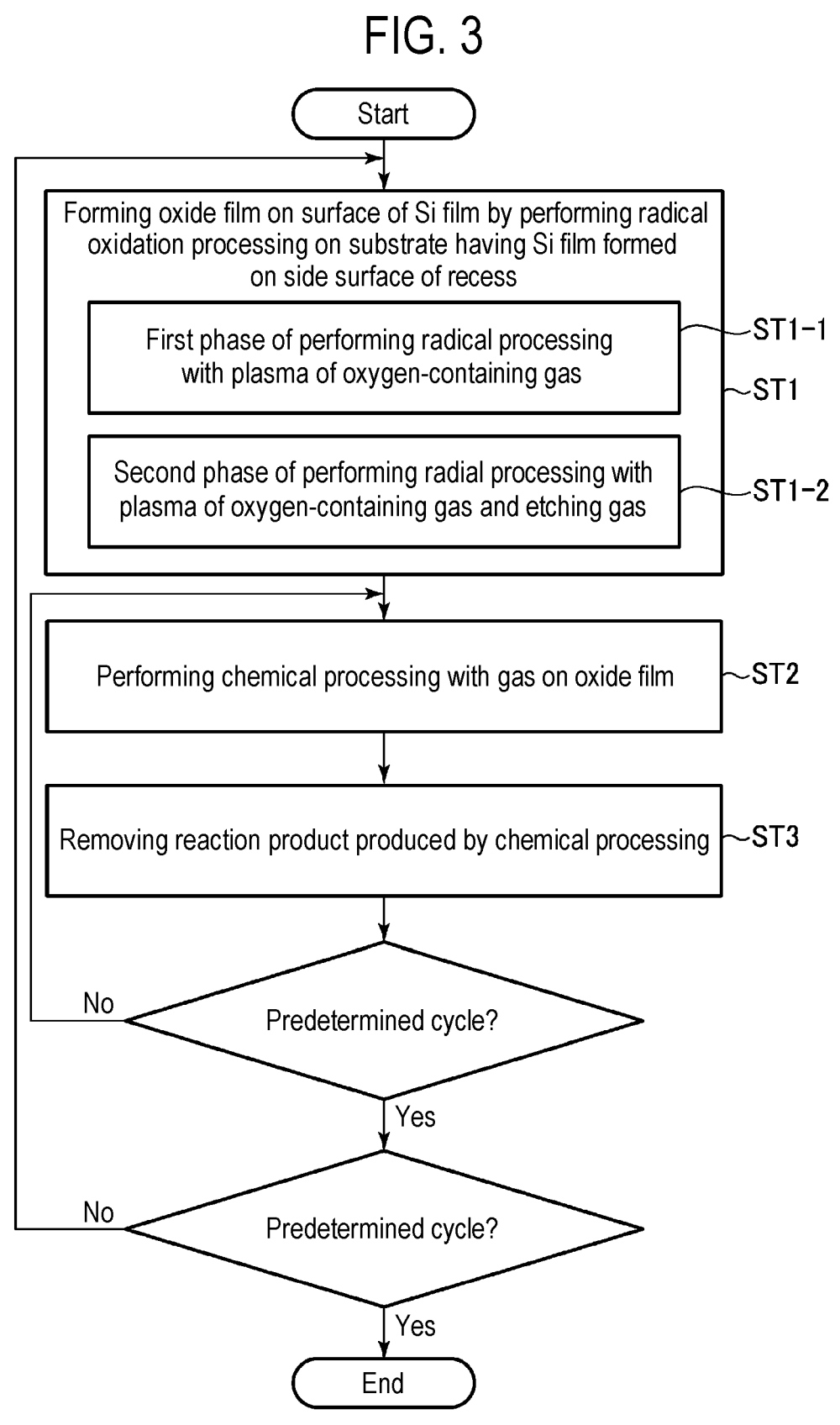

Start

Forming oxide film on surface of Si film by performing radical oxidation processing on substrate having Si film formed on side surface of recess First phase of performing radical processing with plasma of oxygen-containing gas ⟶ ST1-1

⟶ ST1

Second phase of performing radial processing with plasma of oxygen-containing gas and etching gas ⟶ ST1-2

Performing chemical processing with gas on oxide film ⟶ ST2

Removing reaction product produced by chemical processing ⟶ ST3

No ⟵ Predetermined cycle?

Yes

No ⟵ Predetermined cycle?

Yes

End

ETCHING METHOD AND ETCHING APPARATUS

TECHNICAL FIELD

The present disclosure relates to an etching method and an etching apparatus.

BACKGROUND

A process of manufacturing a semiconductor device includes etching silicon (Si) to make it slim. Wet etching is widely used for the etching of such a process. For example, Patent Document 1 describes a method of etching polysilicon by wet etching.

PRIOR ART DOCUMENTS

Patent Documents

Japanese Patent Laid-Open Publication No. 1996-260361

SUMMARY

According to one embodiment of the present disclosure, there is provided an etching method of etching silicon formed on a side surface of a recess that exists in a substrate. The etching method includes: forming an oxide film on a surface of the silicon by performing a radical oxidation processing on the substrate; performing a chemical processing with a gas on the oxide film; and removing a reaction product produced by the chemical processing, wherein the forming the oxide film includes: a first phase of performing a radical processing with a plasma of an oxygen-containing gas; and a second phase of performing a radical processing with a plasma of the oxygen-containing gas and an etching gas, and wherein the forming the oxide film, the performing the chemical processing, and the removing the reaction product are repeated multiple times.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a cross-sectional view illustrating an example of the configuration of a substrate, to which the etching method of the embodiment is applied.

FIG. 3 is a flowchart illustrating another example of the etching method according to the embodiment.

FIG. 8 is a cross-sectional view schematically illustrating a state where the Si film on the lower portion of the recess is oxidized in the second phase of the radical oxidation processing.

FIG. 9 is a partial cross-sectional plan view schematically illustrating an example of a processing system used in the etching method of the embodiment.

FIG. 11 is a view illustrating the result of top-bottom loading when the Si film was etched under the conditions of Experiments 1 to 3 in Experimental Examples.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Etching Method>

Figure 1:
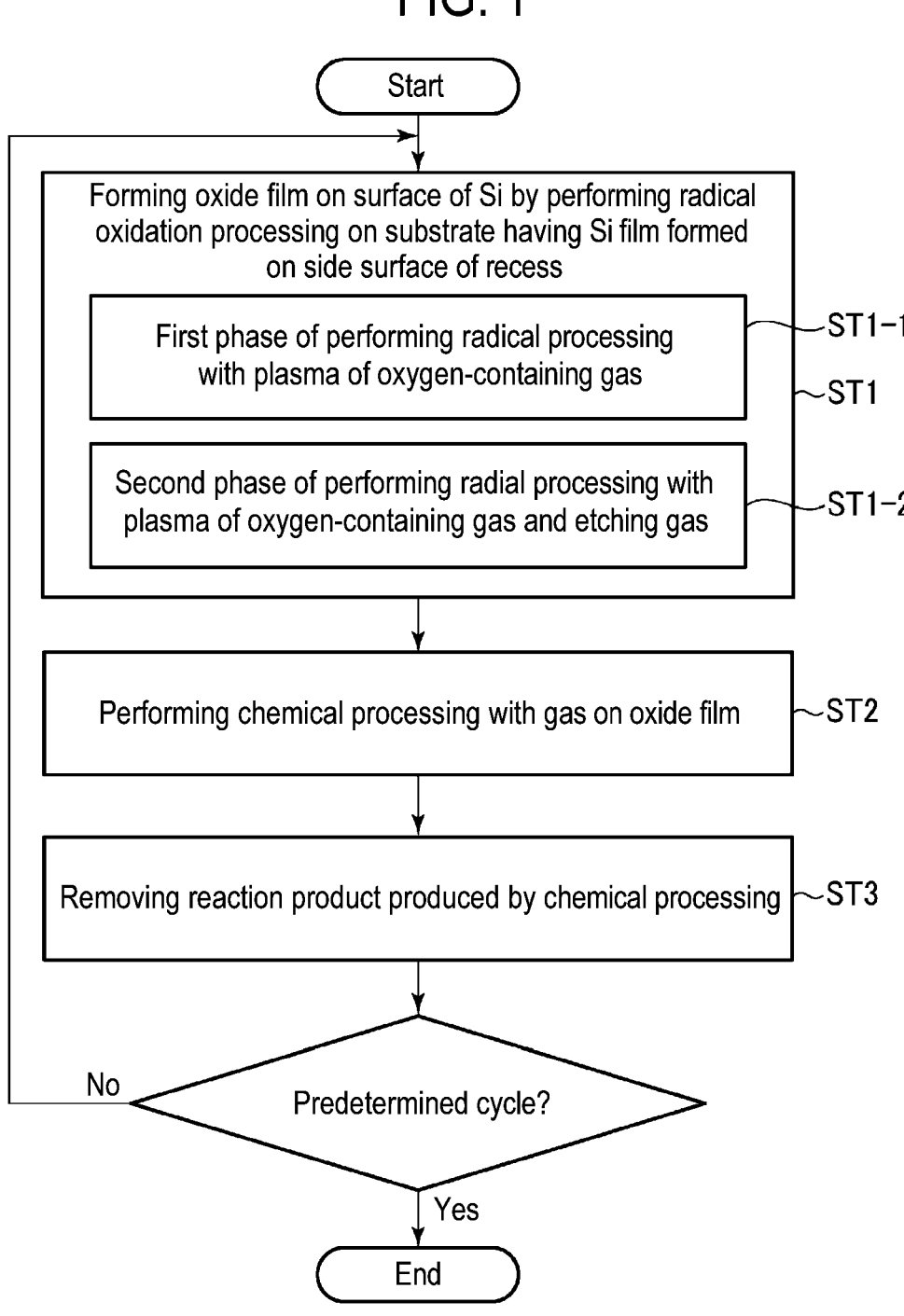
FIG. 1 is a flowchart illustrating an example of an etching method according to an embodiment.

FIG. 1 is a flowchart illustrating an example of an etching method according to an embodiment.

The etching method according to the present embodiment is for etching an Si film formed on the side surface of a recess that exists in a substrate. First, a radical oxidation processing is performed on the substrate having the Si film formed on the side surface of the recess, thereby forming an oxide film on the surface of the Si film (step ST1). Next, a chemical processing with a gas is performed on the oxide film (step ST2). Next, a reaction product produced by the chemical processing of step ST2 is removed (step ST3). These steps ST1 to ST3 are repeated multiple times. Thereby, the Si film existing on the side surface of the recess in the substrate is etched to a desired amount.

Hereinafter, a detailed description will follow.

Figure 2:
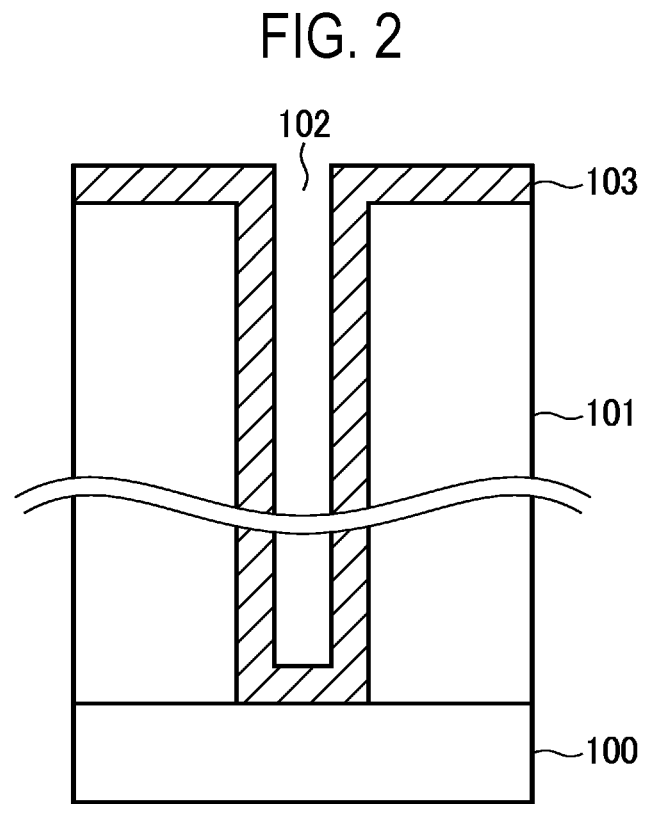

Referring to FIG. 2 illustrating the configuration of a substrate, a structure 101 is provided on a base body 100, a recess 102 is formed in the structure 101, and an Si film 103 is formed on the side surface of the recess. The Si film 103 is an etching target. An example of the substrate is a semiconductor wafer in which the base body 100 is made of a semiconductor such as silicon. An example of the recess 102 is a hole or trench. Further, in an example, the recess 102 has a depth of 4 μm or more. Furthermore, in an example, the recess 102 has an aspect ratio of 60 or more.

Although the configuration of the structure 101 is not particularly limited, one example thereof is an ONON stack structure that is used, for example, in a 3D-NAND type nonvolatile semiconductor apparatus and is formed by alternately stacking an $SiO_2$ film and an SiN film multiple times. In this case, an example of the recess 102 is a memory hole that penetrates the ONON stack structure in the stacking direction. A crystalline Si film, which will form a channel, is formed as the Si film 103 in the memory hole with a multilayered memory film interposed therebetween.

The radical oxidation processing of step ST1 is a processing of generating an oxygen-containing plasma, and acting oxygen radicals (O radicals) in the oxygen-containing plasma on a substrate accommodated in a processing container, thereby forming an oxide film ($SiO_2$ film) on the surface of Si. At this time, it is preferable to use a remote plasma so that O radicals in the oxygen-containing plasma may be mainly supplied to the substrate. The remote plasma generates a plasma of an oxygen-containing gas in a plasma generation space, which is separate from a processing space in which the substrate is disposed, and transports the plasma to the processing space. Since oxygen ions ($O_2$ ions) in the oxygen-containing plasma are easily deactivated during transport, O radicals are mainly supplied to the processing space. Acting mainly O radicals on the substrate may reduce an ion damage to the substrate. Although a plasma source is not particularly limited, inductively coupled plasma, microwave plasma, or the like may be used.

The radical oxidation processing of step ST1 includes a first phase (sub-step ST1-1) of mainly performing a radical processing with a plasma of an oxygen-containing gas and a second phase (sub-step ST1-2) of performing a radical processing with a plasma of an oxygen-containing gas and an etching gas. In the first phase, an Si film on the upper portion of a recess is radically oxidized. In the second phase, the Si film on the lower portion of the recess is radically oxidized while being etched.

The oxygen-containing gas for generating the oxygen-containing plasma used at this time may be $O_2$ gas alone, or may be a mixed gas of $O_2$ gas and at least one of $H_2$ gas and a rare gas. The rare gas is not particularly limited but may be Ar gas. Adding $H_2$ gas may increase oxidation ability.

As the etching gas used in the second phase, a gas including a fluorine-containing gas may be suitably used. The Si film and the Si oxide film are etched by fluorine radicals included in a plasma of the fluorine-containing gas. $NF_3$ gas, $SF_6$ gas, $F_2$ gas, or the like may be used as the fluorine-containing gas. Among these, $NF_3$ gas is suitable. The etching gas used in the second phase may include $H_2$ gas or the like other than the fluorine-containing gas.

In a suitable specific example, the first phase may be performed using $O_2$ gas, $H_2$ gas, and Ar gas, and the second phase may be performed by adding $NF_3$ gas to those gases. In this case, $H_2$ gas also functions both as an oxidation processing gas and as an etching gas.

The pressure in step ST1 is preferably 40 to 1,500 mTorr (53.3 to 199.9 Pa), and more preferably 1,000 to 1,500 mTorr (133.3 to 199.9 Pa). The second phase (sub-step ST1-2) is preferably performed at a lower pressure than the first phase, and preferably within the range of 10 to 30 mTorr. Performing the second phase (sub-step ST1-2) at a low pressure in this way may facilitate bottom-side oxidation of the recess. The temperature of the substrate upon step ST1 is preferably within the range of 15 to 120 degrees C. Further, the time of step ST1 is preferably within the range of 20 to 150 sec for each of the first phase and the second phase. The flow rate of each gas is appropriately set depending on apparatuses.

In the process of performing the chemical processing with the gas on the oxide film in step ST2, the chemical processing with the gas may be a chemical processing using a processing gas including a fluorine-containing gas. With this processing, the oxide film and the processing gas react each other, thereby producing a compound which is removable by heating or the like.

The fluorine-containing gas included in the processing gas may be hydrogen fluoride (HF) gas or the like, and $H_2O$ gas and a reducing gas may be mentioned as a gas other than the fluorine-containing gas. The reducing gas may be ammonia ($NH_3$) gas and an amine-based gas. When reacting the fluorine-containing gas and one of $H_2O$ gas and the reducing gas with the oxide film, a relatively easily removable compound may be produced.

Among these, preferably, HF gas is used as the fluorine-containing gas, and $NH_3$ gas is used as the reducing gas. HF gas and $NH_3$ gas enable the implementation of a chemical oxide removal (COR) processing which is known as an oxide removal processing in the prior art. In the COR processing, HF gas and $NH_3$ gas are adsorbed onto the surface of an oxide film, and ammonium fluorosilicate (AFS), which is an ammonium fluoride-based compound, is produced by a reaction of these gases and the oxide film.

In such a COR processing, the pressure is preferably within the range of 6.66 to 400 Pa (50 to 3,000 mTorr), and more preferably within the range of 13.3 to 266.6 Pa (100 to 2,000 mTorr). Further, the substrate temperature at this time is preferably within the range of 0 to 120 degrees C., and more preferably within the range of 20 to 100 degrees C.

Step ST2 may be performed in the same processing container as in step ST1. Performing these steps in the same processing container may achieve an increased throughput. Of course, these steps may be performed in separate processing containers.

The process of removing the reaction product in step ST3 is performed by supplying an inert gas into the processing container while evacuating the processing container, in a state where the substrate is at a desired temperature. This process may be performed in the same processing container as in the chemical processing with the gas in step ST2, or may be performed in a separate processing container. In either case, the substrate temperature may be appropriately set, and may be the same as or different from that in step ST2. However, if step ST3 is performed in the same processing container as in step ST2, setting the substrate temperature to be equal to that in step ST2 may achieve an increased throughput. If step ST2 is the COR processing, the substrate temperature is preferably within the range of 80 to 120 degrees C. when performing steps ST2 and ST3 in the same processing container. When performing steps ST2 and ST3 in separate processing containers, step ST3 may include heating to a higher temperature than in step ST2 to facilitate the removal of the reaction product. When performing step ST3 in a separate processing container, the temperature of step ST2 may be made lower. Further, as illustrated in FIG. 3, a cycle including step ST2 and step ST3 may be repeated.

Step ST2 and step ST3 may be performed at the same time depending on the gas type and other conditions such as the temperature and pressure. For example, the chemical processing with the gas in step ST2 and the process of removing the reaction product in step ST3 may be performed at the same time by performing the COR processing at the decomposition temperature of AFS. Further, after all processings are completed, a heating processing may be performed to remove a residue in a separate processing container.

Steps ST1 to ST3 may be performed in the same processing container. In this case, from the viewpoint of an increased throughput, it is preferable to perform steps ST1 to ST3 at the same temperature, and if step ST2 is the COR processing, the substrate temperature at that time is preferably within the range of 80 to 120 degrees C.

Figure 4:
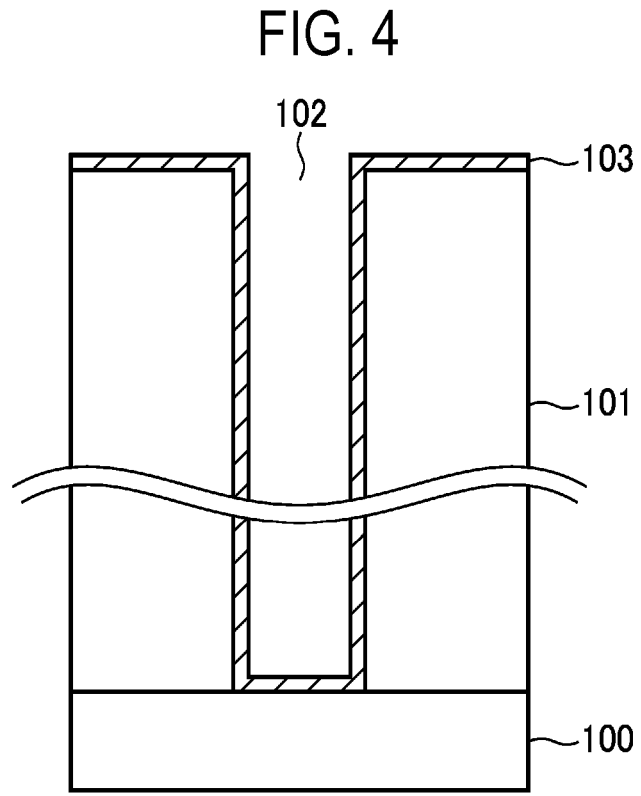
FIG. 4 is a view illustrating the etched state of an Si film on the substrate having the configuration of FIG. 2.

Once steps ST1 to ST3 are performed on the substrate illustrated in FIG. 2, as illustrated in FIG. 4, the Si film 103 is etched, thus being made slim.

In the related art, the wet etching of Si suffers from poor surface roughness since etching proceeds along the grain boundary or crystal plane of Si. In contrast, in the present embodiment, forming the oxide film on the Si surface by the radical oxidation processing and removing the oxide film by a processing including the chemical processing with the gas are repeated. At this time, since the radical oxidation processing is a surface reaction by oxygen radicals, a thin oxide film is formed without depending on the grain boundary or crystal plane. Subsequently, only the oxide film is removed, which may result in good surface roughness. Then, by repeating these a desired number of times, a desired amount of etching may be performed with good controllability.

Figure 5:
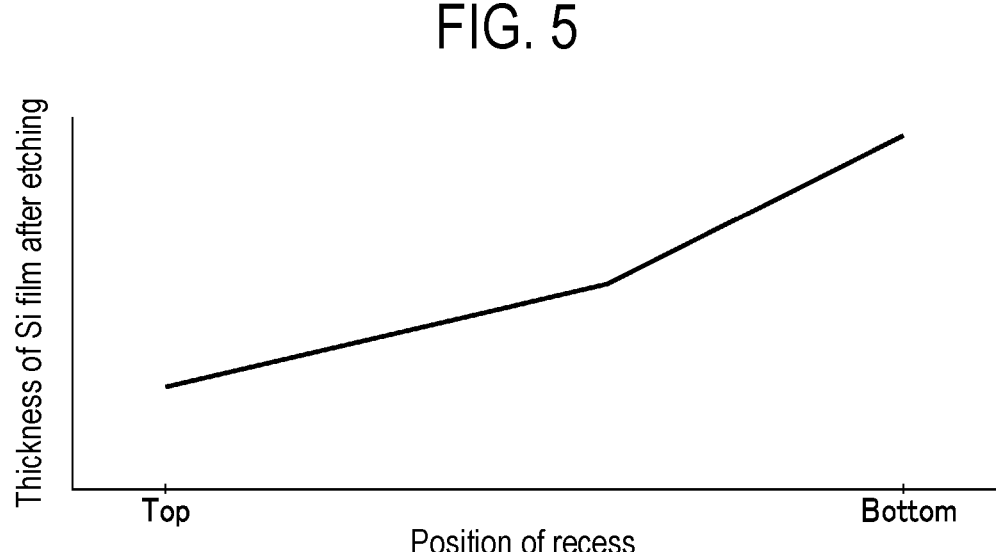
FIG. 5 is a view illustrating top-bottom loading of the Si film in a case where a radical oxidation processing is performed in a first phase when etching the Si film formed on the side surface of a recess.

However, if the depth of the recess is very deep, and particularly is 4 μm or more, it is difficult to achieve a uniform thickness of the Si film on the side surface of the recess after etching by performing only the radical processing with the plasma of the oxygen-containing gas. This tendency is remarkable if the aspect ratio of the recess is 60 or more. Specifically, as illustrated in FIG. 5, top-bottom loading occurs, in which the thickness of the Si film is increased on the bottom side of the recess after etching.

It is contemplated that this is because it is difficult for oxygen radicals to reach the bottom side of the recess if the recess deepens, and thus, few oxygen radicals reach the bottom side. That is, when few oxygen radicals reach the bottom side of the recess, the Si film on the bottom side of the recess is difficult to be oxidized, and as a result, the etching amount of the Si film on the bottom side is reduced. For this reason, the Si film after etching is thick on the bottom side, which makes it difficult to achieve a uniform thickness of the Si film.

Hence, in the present embodiment, the radical oxidation processing of step ST1 is performed in two phases including the first phase (sub-step ST1-1) of mainly performing the radical processing with the plasma of the oxygen-containing gas and the second phase (sub-step ST1-2) of performing the radical processing with the plasma of the oxygen-containing gas and the etching gas.

Figure 6:
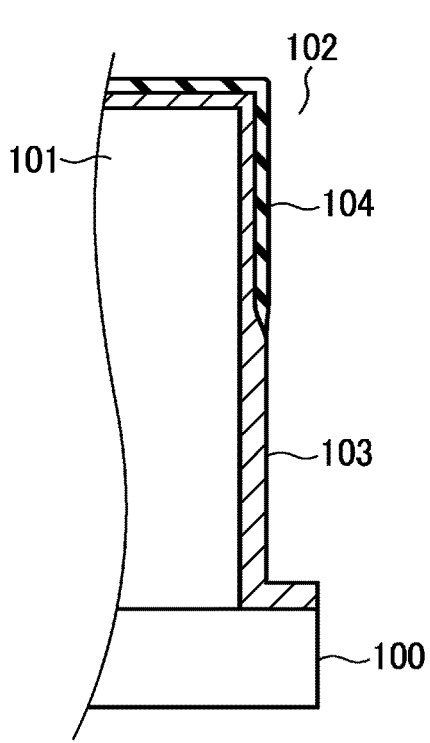
FIG. 6 is a cross-sectional view schematically illustrating a state where the Si film on the upper portion of the recess is oxidized in the first phase of the radical oxidation processing.
Figure 7:
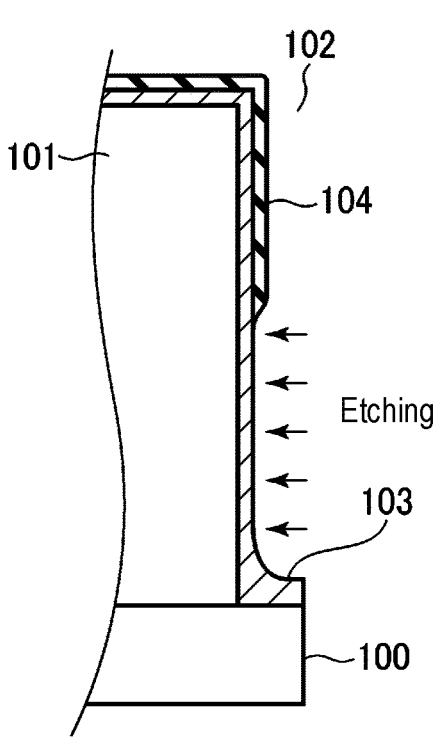
FIG. 7 is a cross-sectional view schematically illustrating a state where the Si film on the lower portion of the recess is etched in a second phase of the radical oxidation processing.
Figure 8:
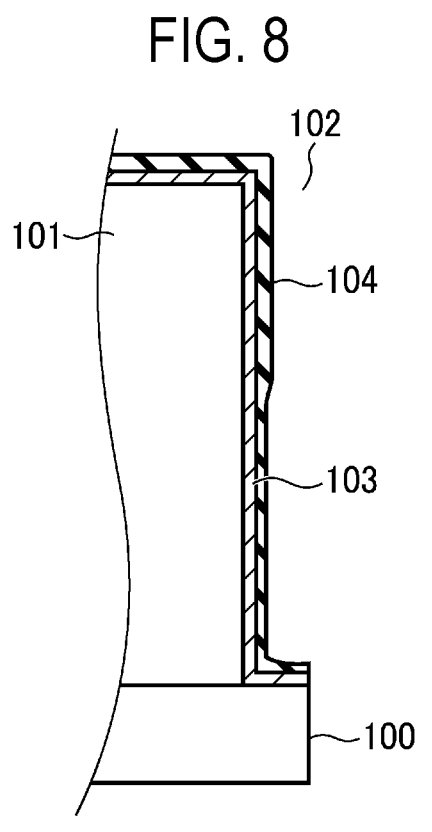

At this time, in the first phase, for example, as illustrated in FIG. 6, the upper portion of the Si film 103 is mainly oxidized by the radical processing with the plasma of the oxygen-containing gas, thereby forming an Si oxide film 104. In the subsequent second phase, the lower portion (bottom side) of the Si film is oxidized while being etched. Thereby, for example, as illustrated in FIG. 7, the Si film 103 on the lower portion (bottom side) of the recess 102 is etched by the radical processing with a plasma of the etching gas by using the Si oxide film 104 on the upper portion as a mask. At the same time, the Si film 103 on the lower portion (bottom side) of the recess 102 is oxidized by the radical processing with a plasma of the oxygen-containing gas, for example, as illustrated in FIG. 8.

As described above, the film thickness of the Si film itself on the bottom side is reduced by etching the Si film on the bottom side of the recess in the second phase, which prevents the film thickness of the Si film on the bottom side from being increased after steps ST2 and ST3 are performed. As a result, the thickness of the Si film after etching may be made uniform from top to bottom.

Further, oxidation of the bottom side of the recess may be facilitated by setting the pressure in the second phase to a low pressure of 10 to 30 mTorr, which is advantageous for accomplishing the uniform thickness of the Si film after etching.

<Example of Processing System>

Figure 9:
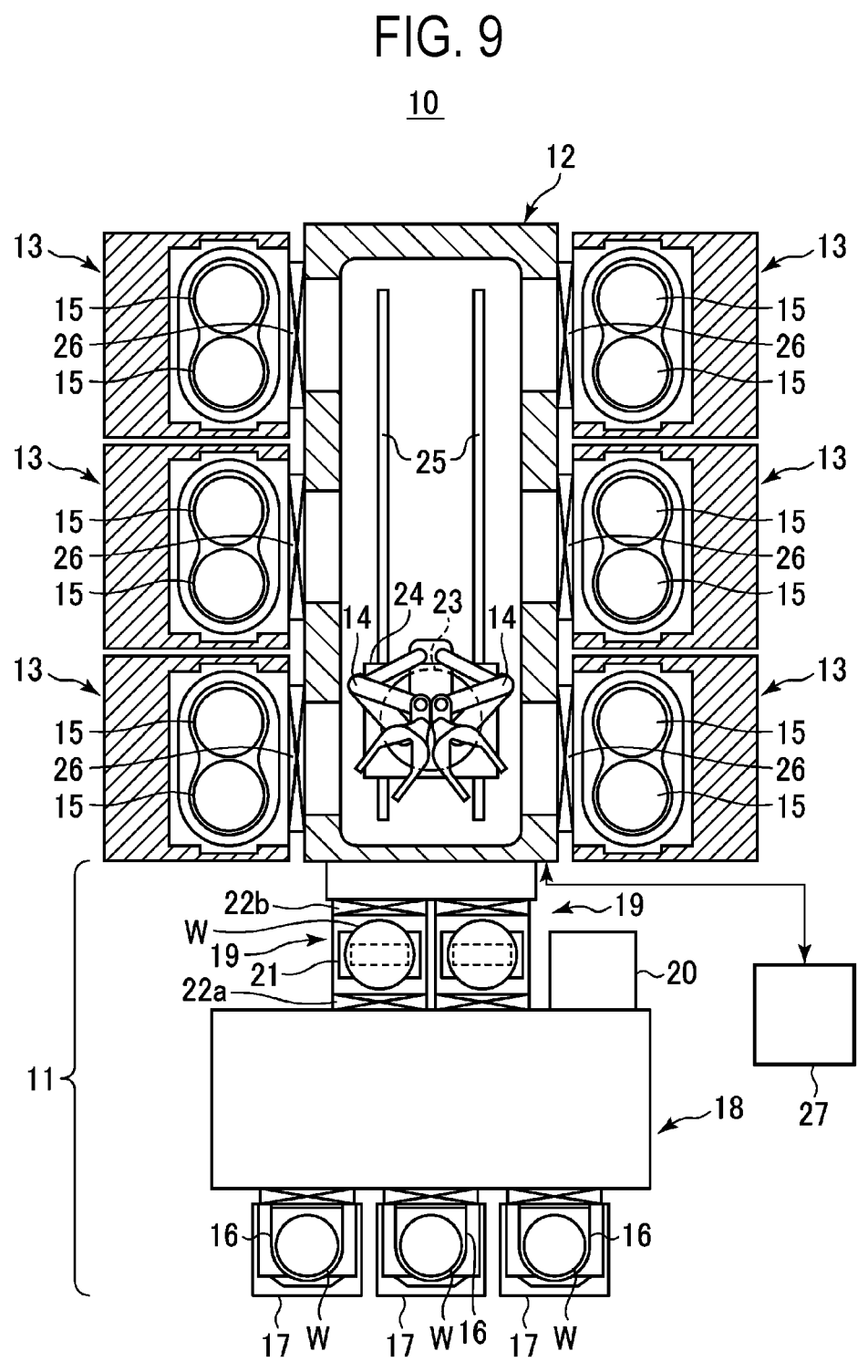

Next, an example of a processing system used in the etching method of the present embodiment will be described. FIG. 9 is a partial cross-sectional plan view schematically illustrating an example of a processing system used in the etching method of the present embodiment.

As illustrated in FIG. 9, the processing system 10 includes a loading/unloading section 11 that stores substrates W and performs loading and unloading of the substrates W, a transfer module 12 that serves as a transport chamber to transport two substrates W at the same time, and process modules 13 that perform a processing on the substrate W loaded from the transfer module 12. Each process module 13 and the transfer module 12 are internally maintained under the vacuum environment.

In the processing system 10, the substrate W stored in the loading/unloading section 11 is transported by a transport arm 14 built in the transfer module 12, so that one substrate W is mounted on each of two stages 15 arranged within the process module 13. Next, in the processing system 10, after each substrate W mounted on the stage 15 is processed by the process module 13, the completely processed substrate W is unloaded to the loading/unloading section 11 by the transport arm 14.

The loading/unloading section 11 includes load ports 17 that serve as a mounting table of a FOUP 16, which is a container accommodating substrates W therein, a loader module 18 that receives the stored substrate W from the FOUP 16 mounted on each load port 17 or delivers the substrate W completely processed in the process module 13 to the FOUP 16, two load lock modules 19 that temporarily hold and support the substrate W to transfer the substrate W between the loader module 18 and the transfer module 12, and a cooling storage 20 that cools the substrate W subjected to a heating processing.

The loader module 18 is formed of a rectangular housing having an interior of the atmospheric pressure environment, and the load ports 17 are arranged side by side on one side surface constituting the long side of the rectangle. Further, the loader module 18 has a transport arm (not illustrated) which is movable therein in the longitudinal direction of the rectangle. That transport arm loads the substrate W from the FOUP 16 mounted on each load port 17 to the load lock module 19, or unloads the substrate W from the load lock module 19 to each FOUP 16.

Each load lock module 19 temporarily holds the substrate W in order to deliver the substrate W, which is accommodated in the FOUP 16 mounted on each load port 17 under the atmospheric pressure environment, to the process module 13 having an interior of the vacuum environment. Each load lock module 19 has a buffer plate 21 that holds two substrates W. Further, each load lock module 19 has a gate valve 22a for ensuring airtightness with respect to the loader module 18 and a gate valve 22b for ensuring airtightness with respect to the transfer module 12. Furthermore, the load lock module 19 is connected to a gas introduction system and a gas exhaust system, which are not illustrated, via piping, so that the interior of the load lock module 19 is switchable between the atmospheric pressure environment and the vacuum environment.

The transfer module 12 loads the unprocessed substrate W from the loading/unloading section 11 to the process module 13, and unloads the completely processed substrate W from the process module 13 to the loading/unloading section 11.

The transfer module 12 is formed of a rectangular housing having an interior of the vacuum environment, and includes two transport arms 14 that hold and move two substrates W, a rotary table 23 that rotatably supports each transport arm 14, a rotary mounting table 24 on which the rotary table 23 is mounted, and a guide rail 25 that guides the rotary mounting table 24 so as to be movable in the longitudinal direction of the transfer module 12. Further, the transfer module 12 is connected to the load lock modules 19 of the loading/unloading section 11 and each process module 13 via the gate valves 22*b* and each gate valve 26 to be described later. In the transfer module 12, the transport arms 14 transport two substrates W from the load lock modules 19 to each process module 13, and unloads the processed two substrates W from each process module 13 to another process module 13 or the load lock modules 19.

In the processing system 10, each process module 13 is for etching the Si film which is an etching target. The process module 13 may perform the above steps ST1 to ST3 collectively, or may include one for performing steps ST1 and ST2 and one for performing step ST3 separately.

The processing system 10 includes a controller 27. The controller 27 includes a main controller having a CPU which controls the operation of each component of the processing system 10, an input device (e.g., a keyboard or mouse), an output device (e.g., a printer), a display device (e.g., a display), and a storage device (storage medium). The main controller of the controller 27 causes the processing system 10 to execute a predetermined operation, for example, based on a processing recipe stored in the storage medium built in the storage device or the storage medium set in the storage device.

<Etching Apparatus>

Figure 10:
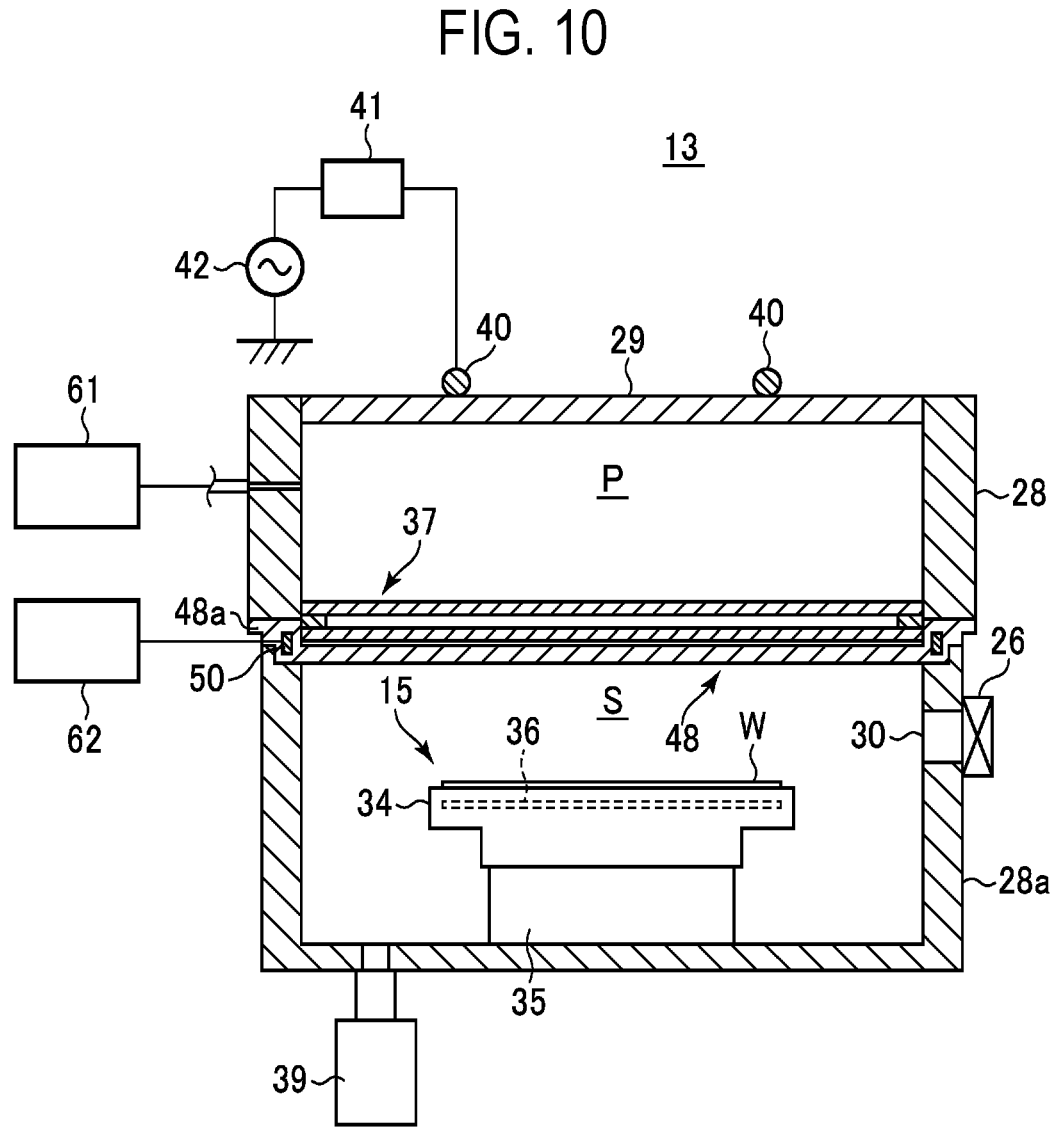
FIG. 10 is a cross-sectional view schematically illustrating an example of a process module, which is mounted in the processing system of FIG. 9 and functions as an etching apparatus of performing the etching method of the embodiment.

Next, an example of the process module 13, which is mounted in the processing system 10 and functions as an etching apparatus of performing the etching method of the present embodiment, will be described. FIG. 10 is a cross-sectional view schematically illustrating an example of the process module 13 functioning as the etching apparatus in the processing system of FIG. 9.

As illustrated in FIG. 10, the process module 13 functioning as the etching apparatus includes a hermetically sealed processing container 28 that accommodates the substrate W therein. The processing container 28 is made of, for example, aluminum or an aluminum alloy, and has an open upper end. The upper end of the processing container 28 is closed with a lid 29 which forms a ceiling portion. A loading/unloading port 30 for the substrate W is provided in a sidewall portion 28*a* of the processing container 28, and may be opened and closed by the aforementioned gate valve 26.

Further, as described above, two stages 15 (only one of which is illustrated), on which the substrates W are respectively placed one by one in a horizontal state, are arranged on the inner bottom of the processing container 28. The stage 15 has a substantially cylindrical shape, and includes a mounting plate 34 on which the substrate W is directly mounted, and a base block 35 which supports the mounting plate 34. A temperature adjustment mechanism 36 is provided within the mounting plate 34 to adjust the temperature of the substrate W. The temperature adjustment mechanism 36 has, for example, a duct (not illustrated) through which a temperature adjustment medium circulates, and adjusts the temperature of the substrate W by performing heat exchange between the temperature adjustment medium flowing in the duct and the substrate W. If the control temperature is a high temperature, the temperature adjustment mechanism 36 may be a heater, or may include the duct, through which the temperature adjustment medium circulates, as well as the heater. Further, the stage 15 is provided with lifting pins (not illustrated) which are used when loading or unloading the substrate W into or from the processing container 28 such that the lifting pins are able to protrude or retract to or from the upper surface of the mounting plate 34.

The interior of the processing container 28 is partitioned into an upper plasma generation space P and a lower processing space S by a partition plate 37. The partition plate 37 functions as a so-called ion trap that prevents permeation of ions in a plasma from the plasma generation space P to the processing space S when an inductively coupled plasma is generated in the plasma generation space P. The plasma generation space P is a space in which the plasma is generated, and the processing space S is a space in which the substrate W is etched by a radical processing. A first gas supply 61 and a second gas supply 62 are provided outside the processing container 28.

The first gas supply 61 supplies $O_2$ gas, $H_2$ gas, $NF_3$ gas which is a fluorine-containing gas, or a rare gas (e.g., Ar gas) to the plasma generation space P. These gases are formed into a plasma in the plasma generation space P. In addition, the rare gas functions as a plasma generation gas, but also functions as a pressure adjustment gas, a purge gas, or the like.

The second gas supply 62 supplies a processing gas used for a chemical processing, for example, HF gas and $NH_3$ gas as described above, and the rare gas which is used as a pressure adjustment gas, a purge gas, or a dilution gas to the processing space S.

An evacuation mechanism 39 is connected to the bottom of the processing container 28. The evacuation mechanism 39 has a vacuum pump and evacuates the interior of the processing space S.

A heat shielding plate 48 is provided below the partition plate 37 so as to face the substrate W. Since heat is accumulated in the partition plate 37 due to repeated plasma generation in the plasma generation space P, the heat shielding plate 48 is for preventing the accumulated heat from having an effect on the distribution of radicals in the processing space S. The heat shielding plate 48 is formed larger than the partition plate 37, and a flange portion 48*a*, which constitutes a peripheral edge portion of the heat shielding plate 48, is embedded in the sidewall portion 28*a* of the processing container 28. In addition, a cooling mechanism 50, for example, a refrigerant flow path, a chiller, or a Peltier element is embedded in the flange portion 48*a*.

The lid 29, which forms the ceiling portion of the processing container 28, is formed of, for example, a circular quartz plate, and is configured as a dielectric window. An annular RF antenna 40 is formed on the lid 29 to generate the inductively coupled plasma in the plasma generation space P of the processing container 28. The RF antenna 40 is connected to a radio frequency power supply 42 via a matcher 41. The radio frequency power supply 42 outputs, at a predetermined output value, radio frequency power with a predetermined frequency (e.g., 13.56 MHz or more) suitable for plasma generation by radio frequency discharge of the inductively coupled plasma. The matcher 41 has a reactance variable matching circuit (not illustrated) for matching the impedance on the radio frequency power supply 42 side with the impedance on a load (RF antenna 40 or plasma) side.

In addition, in a case of providing the process module which performs only a heating processing, the process module configured by omitting the plasma generation mechanism and the partition plate from the process module having the above-described configuration is used.

With the processing system 10, when performing the etching method according to the embodiment, first, the substrate W having the configuration illustrated in FIG. 2, for example, is taken out of the FOUP 16 by the transport arm of the loader module 18, and is loaded into the load lock module 19. After the load lock module 19 is evacuated, the substrate W in the load lock module 19 is loaded into the process module 13, which functions as the etching apparatus, by the transport arm 14 of the transfer module 12. Then, in the process module 13 functioning as the etching apparatus, a processing corresponding to steps ST1 to ST3 described above is performed as follows.

At this time, the temperature of the stage 15 of the process module 13 is adjusted in advance to a desired substrate temperature by the temperature adjustment mechanism 36. For example, the temperature is adjusted to 80 to 120 degrees C., which is a preferable substrate temperature when steps ST1 to ST3 described above are performed in the same processing container. In this state, the substrate W mounted on the stage 15 is held for a predetermined time, for example, 120 sec, so that the wafer temperature is stabilized to a predetermined temperature.

Next, after purging the interior of the processing container 28, the pressure in the processing container 28 is preferably set to 40 to 1,500 mTorr (53.3 to 199.9 Pa), and more preferably 1,000 to 1,500 mTorr (133.3 to 199.9 Pa), and an oxygen-containing plasma is generated to perform the radical oxidation processing of step ST1.

When performing the radical oxidation processing, first, in the first phase, the oxygen-containing gas is supplied from the first gas supply 61 to the plasma generation space P, and at the same time, radio frequency power is supplied to the RF antenna 40 to generate an inductively coupled plasma. The plasma generated in the plasma generation space P is transported to the processing space S through the partition plate 37. At this time, oxygen ions are deactivated in the partition plate 37, and mainly O radicals in the plasma are selectively introduced into the processing space S. By these O radicals, the upper portion of the Si film formed on the side surface of the recess of the substrate W is radically oxidized, thereby forming an oxide film.

Next, in the second phase, the oxygen-containing gas and the fluorine-containing gas as the etching gas are supplied from the first gas supply 61 to the plasma generation space P, and at the same time, radio frequency power is supplied to the RF antenna 40 to generate an inductively coupled plasma. The plasma generated in the plasma generation space P is transported to the processing space S through the partition plate 37, oxygen ions and fluorine ions are deactivated in the partition plate 37, and O radicals and F radicals in the plasma are selectively introduced into the processing space S. By these F radicals, the Si film on the lower portion (bottom side) of the recess is etched by using the Si oxide film on the upper portion of the side surface of the recess of the substrate W as a mask, and also, by these O radicals, the Si film on the lower portion (bottom side) of the recess is oxidized. The oxidation on the bottom side of the recess may be facilitated by setting the pressure in the second phase to a low pressure of 10 to 30 mTorr.

At this time, the oxygen-containing gas may be $O_2$ gas alone, and $H_2$ gas may be added to $O_2$ gas. Further, the rare gas such as Ar gas may further be supplied. Further, the fluorine-containing gas, which is the etching gas, may be $NF_3$ gas, and $H_2$ gas may be added.

For the flow rates of the gases, the flow rate of $O_2$ gas is preferably 20 to 200 sccm. Further, when $H_2$ gas and the rare gas (Ar gas) are supplied, the flow rates thereof are preferably 200 sccm or less and 30 to 200 sccm, respectively. Further, the flow rate of $NF_3$ gas which is the fluorine-containing gas is preferably 0.1 to 5 sccm. The plasma generation power is preferably 400 to 800 W.

After the radical oxidation processing as described above, the interior of the processing container 28 is purged, and the chemical processing with the gas in step ST2 is performed on the oxide film. At this time, in a state where the pressure in the processing container 28 is preferably within the range of 100 to 1,500 mTorr (13.3 to 200 Pa) and the temperature of the stage 15 (substrate W) is maintained at 80 to 120 degrees C. by the temperature adjustment mechanism 36, the processing gas including the fluorine-containing gas, for example, HF gas and $NH_3$ gas are supplied from the second gas supply 62 to the processing space S of the processing container 28. Thereby, the processing gas reacts with the oxide film to generate a reaction product which is easily decomposed. For example, HF gas and $NH_3$ gas are adsorbed to the substrate W, and react with the oxide film, thus generating AFS which is an ammonium fluoride-based compound.

When HF gas and $NH_3$ gas are used, preferably, the flow rate of HF gas is set to 50 to 100 sccm, the flow rate of $NH_3$ gas is set to 300 to 400 sccm, and the flow rate of the inert gas (Ar gas) is set to 200 to 400 sccm.

After the chemical processing as described above, the interior of the processing container 28 is purged, and the processing of removing the reaction product in step ST3 is performed. Here, for example, the processing of removing AFS which is an ammonium fluoride-based compound is performed. For the removal of AFS, in a state where the temperature of the stage 15 (substrate W) is maintained at 80 to 120 degrees C. by the temperature adjustment mechanism 36, the inert gas is supplied into the processing container 28 while evacuating the processing container 28, thus causing sublimation of AFS.

This processing of removing the reaction product may be performed in a processing container of an apparatus, which is separate from the radical oxidation processing and the chemical processing with the gas. In this case, since the processing of removing the reaction product may be performed at a higher heating temperature of, for example, 300 degrees C. compared to the radical oxidation processing and the chemical processing with the gas, the radical oxidation processing and the chemical processing with the gas may be performed at further reduced temperatures.

As the radical oxidation processing, the chemical processing with the gas, and the processing of heating and removing the reaction product as described above are repeated multiple times, the Si film is etched to a desired thickness. In this way, the oxide film is formed by performing the radical oxidation processing, and thereafter, the chemical processing with the gas and the processing of removing the reaction products are performed, which may enable the Si film to be etched with good surface roughness and good controllability. Further, with the radical oxidation processing in two phases including the first phase and the second phase, the Si film on the lower portion (bottom side) of the recess of the substrate may be oxidized while being etched, which may result in the uniform thickness of the Si film on the side surface of the recess after etching even in the case of a deep recess.

11

Experimental Examples

Next, Experimental Examples will be described.

Here, the etching of an Si film was performed by the apparatus illustrated in FIGS. 9 and 10 with respect to the substrate having the configuration illustrated in FIG. 2. The substrate had, as a recess, a hole having a depth of 4 μm or more and an aspect ratio of 60 or more, and an Si film having a thickness of 10 nm was formed on the side surface of the hole.

The etching of the Si film was performed using the etching apparatus illustrated in FIG. 10 with respect to this substrate. During etching, according to the present embodiment, a radical oxidation processing was first performed in two phases, and then, a chemical processing for the removal of an Si oxide film was performed and also a reaction product removal processing was performed (Experiment 1). The conditions at this time are illustrated below.

1. Radical Oxidation Processing
First Phase
    pressure: 50 to 100 mTorr
    temperature: 80 to 120 degrees C.
    flow rate of O₂ gas: 20 to 200 sccm
    flow rate of Ar gas: 30 to 200 sccm
    time: 20 to 150 sec
Second Phase
    pressure: 10 to 30 mTorr
    temperature: 80 to 120 degrees C.
    flow rate of O₂ gas: 20 to 200 sccm
    flow rate of Ar gas: 30 to 200 sccm
    flow rate of NH₃ gas: 0.1 to 5 sccm
    flow rate of H₂ gas: 200 sccm or less
    time: 20 to 150 sec
2. Chemical Processing
    pressure: 100 to 1,500 m Torr
    temperature: 80 to 120 degrees C.
    flow rate of HF gas: 50 to 100 sccm
    flow rate of NH₃ gas: 300 to 400 sccm
    flow rate of Ar gas: 200 to 400 sccm
    flow rate of N₂ gas: 10 to 2,000 sccm
    time: 60 to 300 sec
3. Reaction Product Removal Processing
    temperature: 80 to 120 degrees C.
    pressure: 10 to 5,000 mTorr (1.33 to 667 Pa)
    flow rate of N₂ gas: 10 to 2,000 sccm
    Further, among the above conditions, the conditions of the first phase and the second phase of a radical oxidation processing were changed as follows, and then, a chemical processing and a product removal processing were performed under the same conditions as in Experiment 1 (Experiment 2).
First Phase
    pressure: 1,000 to 1,500 mTorr
    temperature: 80 to 120 degrees C.
    flow rate of O₂ gas: 20 to 200 sccm
    flow rate of Ar gas: 30 to 200 sccm
    time: 20 to 150 sec
Second Phase
    pressure: 10 to 30 mTorr
    temperature 80 to 120 degrees C.
    flow rate of O₂ gas: 20 to 200 sccm
    flow rate of Ar gas: 30 to 200 sccm
    flow rate of NH₃ gas: 0.1 to 5 sccm
    flow rate of H₂ gas: 200 sccm or less
    time: 20 to 150 sec

12

Further, for comparison, a chemical processing and a reaction product removal processing were performed without performing a radical oxidation processing (Experiment 3).

Figure 11:
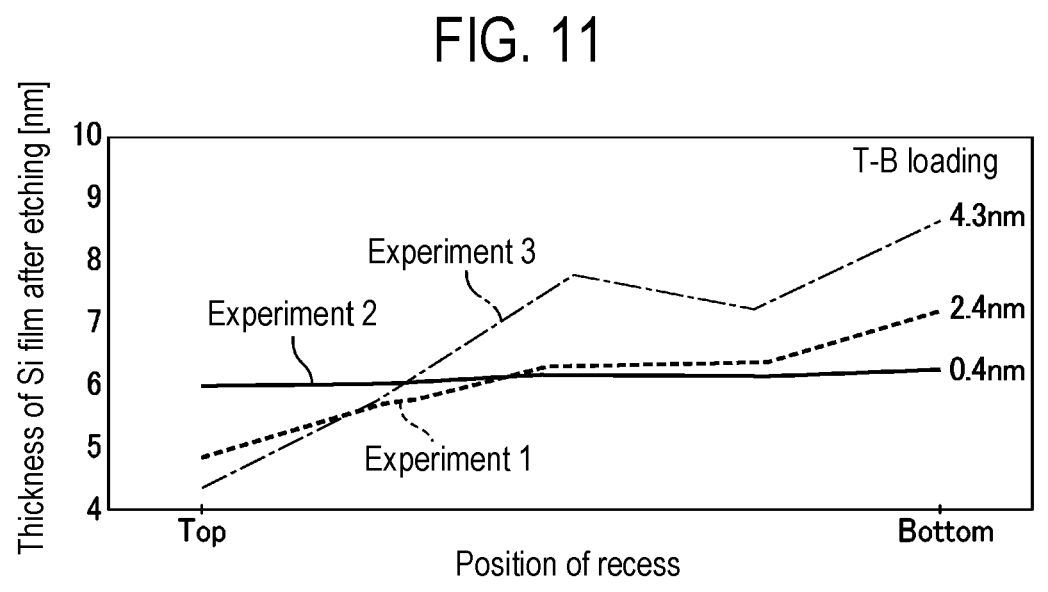

As a result, as illustrated in FIG. 11, in Experiment 3, top-bottom loading of the Si film after etching was a large value of 4.3 nm, but in Experiment 1 in which the radical oxidation processing was performed in two phases, top-bottom loading of the Si film was improved to 2.4 nm. Further, in Experiment 2 in which the radical oxidation processing was performed in two phases and the conditions were tuned, top-bottom loading of the Si film was 0.4 nm, whereby the extremely high thickness uniformity of the Si film was achieved after etching.

Other Applications

Although the embodiment has been described above, the embodiment disclosed herein should be considered to be exemplary and not restrictive in all respects. The above embodiment may be omitted, replaced, or modified in various ways without departing from the scope and spirit of the appended claims.

For example, the apparatus of the above embodiment is merely an example, and other apparatuses having various configurations may be used. Further, although a case where a semiconductor wafer is used as a target substrate has been illustrated, the substrate is not limited to the semiconductor wafer, and may be any other substrate such as a flat panel display (FPD) substrate as a representative substrate for a liquid crystal display (LCD), a ceramics substrate, or the like.

According to the present disclosure in some embodiments, it is possible to provide an etching method and an etching apparatus which are capable of achieving the uniform thickness of Si after etching with good surface roughness when etching Si formed on the side surface of a deep recess which exists in a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method of etching silicon formed on a side surface of a recess that exists in a substrate, the etching method comprising:
    forming an oxide film on a surface of the silicon by performing a radical oxidation processing on the substrate;
    performing a chemical processing with a gas on the oxide film; and
    removing a reaction product produced by the chemical processing,
    wherein the forming the oxide film includes:
        a first phase of forming a silicon oxide film on an upper portion of the recess by radically oxidizing the silicon on the upper portion with a plasma of an oxygen-containing gas; and
        a second phase of forming the silicon oxide film on a lower portion of the recess by radically oxidizing the silicon on the lower portion with the plasma of the oxygen-containing gas, and etching the silicon on the lower portion with a plasma of an etching gas, and wherein the forming the oxide film, the performing the chemical processing, and the removing the reaction product are repeated multiple times.

2. The etching method of claim 1, wherein a pressure when performing the second phase is lower than a pressure when performing the first phase.

3. The etching method of claim 1, wherein the oxygen-containing gas is $O_2$ gas alone, or a mixed gas of $O_2$ gas and at least one of $H_2$ gas and a rare gas.

4. The etching method of claim 1, wherein the plasma is a remote plasma generated in a plasma generation space separate from a processing space in which the substrate is disposed, and a radical in the plasma is supplied to the substrate.

5. The etching method of claim 1, wherein a cycle including the performing the chemical processing and the removing the reaction product is repeated multiple times.

6. The etching method of claim 1, wherein the forming the oxide film and the performing the chemical processing are performed in the same processing container.

7. The etching method of claim 1, wherein the performing the chemical processing and the removing the reaction product are performed in the same processing container.

8. The etching method of claim 1, wherein the forming the oxide film, the performing the chemical processing, and the removing the reaction product are performed in the same processing container.

9. The etching method of claim 1, wherein the performing the chemical processing and the removing the reaction product are performed in separate processing containers.

10. The etching method of claim 1, wherein the etching gas includes a fluorine-containing gas.

11. The etching method of claim 10, wherein the fluorine-containing gas is $NF_3$ gas.

12. The etching method of claim 1, wherein the recess has a depth of 4 μm or more.

13. The etching method of claim 12, wherein the recess has an aspect ratio of 60 or more.

14. The etching method of claim 1, wherein the chemical processing with the gas is performed with a processing gas including a fluorine-containing gas.

15. The etching method of claim 14, wherein the processing gas including the fluorine-containing gas includes the fluorine-containing gas and at least one of $H_2O$ gas and a reducing gas.

16. The etching method of claim 14, wherein the processing gas including the fluorine-containing gas includes HF gas as the fluorine-containing gas, and includes $NH_3$ gas as a reducing gas.

17. The etching method of claim 16, wherein the reaction product is an ammonium fluoride-based compound produced after the chemical processing.

* * * * *